(12) United States Patent
Ishida et al.

(10) Patent No.: US 6,201,185 B1
(45) Date of Patent: Mar. 13, 2001

(54) SUBSTRATE FOR MOUNTING ELECTRONIC PART HAVING CONDUCTIVE PROJECTIONS AND PROCESS FOR MANUFACTURING THE SAME

(75) Inventors: Naoto Ishida; Teruo Hayashi; Kiyotaka Tsukada, all of Gifu-ken (JP)

(73) Assignee: Ibiden Co., Ltd., Gifu-Ken (JP)

( * ) Notice: Subject to any disclaimer, the term of this patent is extended or adjusted under 35 U.S.C. 154(b) by 0 days.

(21) Appl. No.: 09/091,505

(22) PCT Filed: Dec. 16, 1996

(86) PCT No.: PCT/JP96/03672

§ 371 Date: Sep. 9, 1998

§ 102(e) Date: Sep. 9, 1998

(87) PCT Pub. No.: WO97/24021

PCT Pub. Date: Jul. 3, 1997

(30) Foreign Application Priority Data

Dec. 22, 1995 (JP) .................................................. 7-350323
Nov. 1, 1996 (JP) .................................................. 8-307402
Nov. 21, 1996 (JP) .................................................. 8-327898

(51) Int. Cl.$^7$ .............................. H01L 23/02; H05K 1/16
(52) U.S. Cl. ...................... 174/52.4; 174/260; 174/261; 361/780; 361/783; 361/764; 29/832; 29/835
(58) Field of Search .................................. 174/260, 52.4, 174/52.1, 261; 361/761, 762, 763, 764, 780, 782, 783, 769; 257/693, 678; 29/832, 835

(56) References Cited

U.S. PATENT DOCUMENTS 3,908,075 * 9/1975 Jackson et al. ........................ 428/133

4,547,795 10/1985 Wulff .
4,822,988 * 4/1989 Gloton .................................... 235/492

FOREIGN PATENT DOCUMENTS

| 57-115850 | 7/1982 | (EP) . |
| 261 013 | 3/1988 | (EP) . |
| 463 763 | 1/1992 | (EP) . |
| 593 199 | 4/1994 | (EP) . |
| 2-232986 | 9/1900 | (JP) . |
| 56-26487 | 3/1981 | (JP) . |
| 6-188534 | 7/1994 | (JP) . |

* cited by examiner

*Primary Examiner*—Jeffrey Gaffin
*Assistant Examiner*—Kamand Cuneo
(74) *Attorney, Agent, or Firm*—Sughrue, Mion, Zinn, Macpeak & Seas, PLLC

(57) ABSTRACT

A plurality of side-surface patterns 11 and 12 are disposed on the wall surfaces of a mount opening portion 2 for mounting electronic parts thereat. The mount opening portion includes projection portions 21 that project toward an interior thereof from the wall surfaces thereof. End portions of the respective side-surface patterns 11 and 12 extend to the side surfaces of the projection portions 21. Also, a plurality of side-surface patterns can be provided on the wall surfaces of the mount opening portion by etching the side-surface pattern non-formation portions of the conductive layer formed on the entirety of the wall surfaces of the mount opening portion in a state where the side-surface pattern formation portions are coated with a side-surface pattern resist film made of a negative photosensitive resin. With this structure, the side-surface patterns can be prevented from being peeled off, and side-surface patterns having a plurality of potentials can be readily formed.

6 Claims, 16 Drawing Sheets

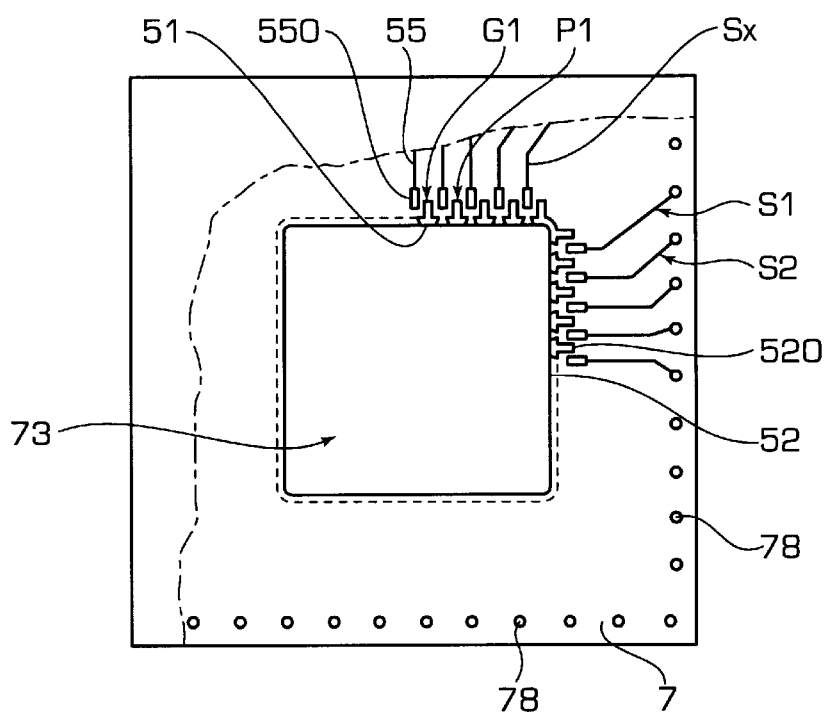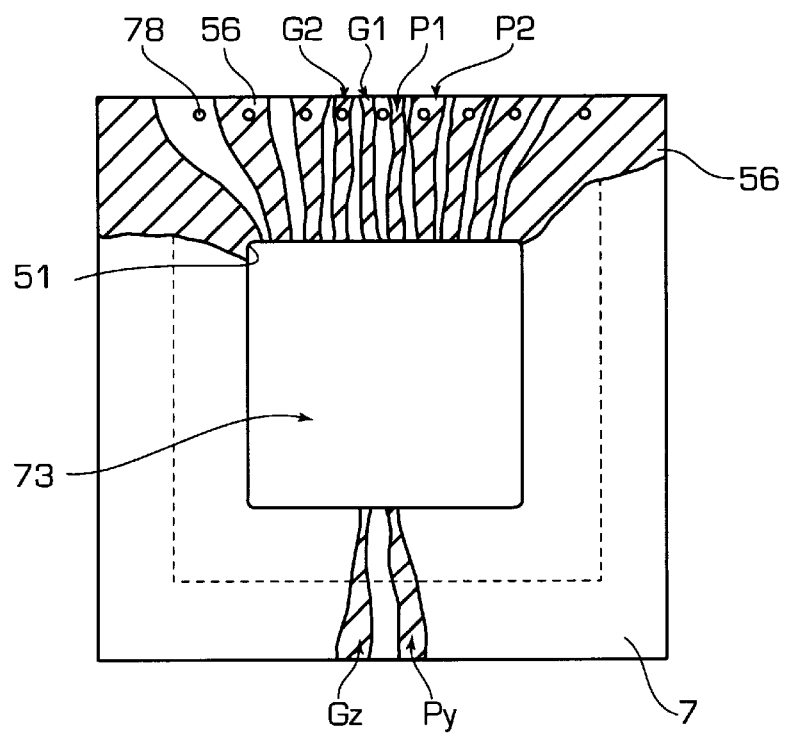

SUBSTRATE FOR MOUNTING ELECTRONIC PART HAVING CONDUCTIVE PROJECTIONS AND PROCESS FOR MANUFACTURING THE SAME

TECHNICAL FIELD

The present invention relates to an electronic parts mounting substrate in which side-surface patterns having a plurality of potentials are disposed on wall surfaces of a mount opening portion for mounting the electronic parts, and a method of manufacturing same.

TECHNICAL BACKGROUND

Conventionally, as shown in FIG. 27, an electronic parts mounting substrate having a mount opening portion 95 at which electronic parts 8 are mounted (Japanese Patent Application Laid-Open No. Hei 7-86752) has been known. For example, a plurality of side-surface patterns 901 are disposed on wall surfaces of the mount opening portion 95. The side-surface patterns 901 are connected to wiring patterns 53 formed inside of the electronic parts mounting substrate 9.

As shown in FIGS. 27 and 28, the electronic parts 8 mounted at the mount opening portion 95 are electrically connected to band-like side-surface pads 903, disposed above the side-surface patterns 901, through bonding wires 80.

Also, wiring patterns 54, each having a bonding pad 540 at an end thereof, are disposed on an upper surface of the electronic parts mounting substrate 9. The wiring patterns 54 are connected to through-holes 99 provided in the periphery of the electronic parts mounting substrate 9. For example, a lead pin 86 is installed inside each of the through-holes 99.

In manufacturing the above electronic parts mounting substrate, four cut holes 90 having side-surface pattern formation portions as wall surfaces are first formed in an insulating substrate 92, which is an upper layer of the electronic parts mounting substrate, as shown in FIG. 28. The cut holes 90 are arranged in such a manner that they surround, in the form of a square, the peripheral edges of a mount opening portion formation portion 999 on the insulating substrate 92.

Subsequently, a metal plating film 902 is coated on each wall surface of the cut holes 90, and the band-like side-surface pads 903, the wiring patterns 54 and the bonding pads 540 are formed on the upper surface of the insulating substrate 92.

Then, cutting is performed between the wall surfaces of the respective cut holes 90 along dotted lines 900 shown in FIG. 28 by router machining to form the mount opening portion 95, and the plurality of side-surface patterns 901 are formed on the wall surfaces of the mount opening portion 95.

Subsequently, another insulating substrate 91 is laminated and crimped on the bottom surface of the above mentioned insulating substrate 92 to obtain a multi-layer plate 98. The through-holes 99 are formed in the peripheral edge of the multi-layer plate 98, and their interiors are coated with the metal plating film 909. Thereafter, a lead pin 86 is installed inside of each of the through-holes 99. Accordingly, the electronic parts mounting substrate 9 shown in FIG. 27 is obtained.

However, in the above-mentioned conventional electronic parts mounting substrate, there is a risk that the metal plating film 902 at the ends of each of the side-surface patterns 901 will peel off from the wall surface 919 of the mount opening portion 95, as shown in FIG. 29.

In other words, during router machining, the metal plating film 902 at each of the ends of the above side-surface patterns 901 covering on the wall surfaces 919 of the mount opening portion will be drawn and peeled off from the wall surfaces by the blade of the router machining tool. After the metal plating film 902 has been drawn and peeled off from the wall surfaces, the metal plating film 902 will further peel off from the portions of the wall surfaces from which the metal plating film 902 has already peeled off when there is a thermal shock, resulting in a risk that reliable electric conductivity of the side-surface patterns will be interrupted. Consequently, the router machining must be conducted gradually with high accuracy, and since the router machining rate cannot be increased, productivity is lowered.

Also, with the trend toward multiplying the functions of electronic parts in recent years, it has been required that side-surface patterns with various potentials be provided on the electronic parts mounting substrate 9. Therefore, as shown in FIG. 30, it has been proposed that each of the wall surfaces of the mount opening portion 95 be punched at a predetermined portion to form a punched portion 912, and the side-surface pattern 901 be formed between the respective punched portions 912. With this process, side-surface patterns 901 having various potentials such as a power supply circuit P, a grounding circuit G or a signal circuit S can be formed. The side-surface patterns 901 can function as the power supply circuit P, the grounding circuit G or the signal circuit S. However, in this case as well, the end portion 902 of the side-surface pattern 901 may peel off when the mount opening portion 95 is punched.

The present invention has been made in view of the above problems with the prior art, and therefore an object of the present invention is to provide an electronic parts mounting substrate and a method of manufacturing the substrate, which are capable of preventing the side-surface pattern from peeling-off and facilitate the formation of the side-surface patterns having a plurality of potentials.

DISCLOSURE OF THE INVENTION

According to the present invention, the first means for solving the problems is directed to, as defined in the invention of claim 1, an electronic parts mounting substrate having an insulating substrate in which a mount opening portion for mounting electronic parts thereat is formed, and side-surface patterns having a plurality of potentials and provided on the wall surfaces of said mount opening portion, characterized in that projection portions that project toward the interior of said mount opening portion from the side surfaces thereof are disposed at the mount opening portion, and the end portions of the respective side-surface patterns extend to the side surfaces of the projection portions.

The electronic parts mounting substrate according to the present invention has projection portions that project toward the interior of the mount opening portion from the wall surfaces thereof. The end portions of the respective side surfaces extend to the side surfaces of the projection portions. With this arrangement, even if an end portion of the side-surface pattern is peeled off, the peeling-off is restricted to only the end portion of the side-surface pattern that covers the side surface of the projection portion. Consequently, the side-surface pattern can be prevented from being peeled off from the wall surface of the mount opening portion.

Also, there is no risk that the side-surface pattern will be peeled off from the wall surface of the mount opening portion due to thermal shock. Therefore, the electric conductivity of the side-surface patterns can be ensured.

Also, as defined in the invention of claim 2, it is preferable that the projection portion is designed such that the length between its base portion and an inside end portion is 0.1 to 0.5 mm. This enables the peeling-off of the side-surface pattern to be more effectively prevented. Also, there is no risk that the projection portion would become an obstacle when the electronic parts are mounted on the substrate. If the length is less than 0.1 mm, there is a risk that the side-surface pattern would be peeled off, while there is a risk that the projection portion would become an obstacle if the length exceeds 0.5 mm.

In the specification, the base portion of the above projection portion means a position on a straight line connecting a pair of corners which are boundaries between the side surface of the projection portion and the wall surface of the mount opening portion. Also, the inner end of the above mount opening portion means the inner surface of the mount opening portion which faces the interior of the mount opening portion, and no metal plating film is coated on the inner surface of the mount opening portion.

Also, as a first method of manufacturing the above electronic parts mounting substrate, there is provided, for example, as defined in the invention of claim 3, a method of manufacturing an electronic parts mounting substrate in which during manufacture of the electronic parts mounting substrate having an insulating substrate in which a mount opening portion for mounting electronic parts thereat is formed and side-surface patterns having a plurality of potentials and are provided on the wall surfaces of the mount opening portion, a plurality of partition holes having side-surface pattern formation portions as portions of their wall surfaces are first formed in a mount opening portion formation portion of an insulating substrate by sectioning the respective partition holes with partition walls, a metal plating film is then formed on the wall surfaces of the above partition holes, and thereafter the partition walls between the above partition holes are cut by router machining to form the mount opening portion, and of side-surface patterns having a plurality of potentials and are formed on the wall surfaces of the mount opening portion, characterized in that projection portions that project toward the interior of the mount opening portion are formed in such a manner that the portions of the partition walls that section the partition holes remain.

In the method of manufacturing according to the present invention, when the partition walls of the partition holes are router-machined, portions of said partition walls remain, and the projection portions that project toward the interior of the mount opening portion are formed. With this structure, even if the metal plating film of the partition walls is drawn and peeled off by router machining, the peeling-off is restricted to the metal plating film that coats the side surfaces of the projection portions, and the metal plating film that covers the wall surfaces of the mount opening portion is not peeled off. Accordingly, side-surface patterns which are in close contact with the wall surfaces of the mount opening portion can be formed.

Also, even if the metal plating film is peeled off from the projection portion which has been cut, since the peeling-off is restricted to the projection portion, high accuracy router machining is not required. Also, since the router machining is conducted at a position away-from the wall surfaces of the mount opening portion, except for portions of the partition walls between the partition holes, the cutting can be made with a router machining tool without damaging the metal plating film that covers the wall surfaces of the mount opening portion, and the cutting is facilitated. Therefore, the electronic parts mounting substrate can be readily formed without damaging the side-surface patterns.

For the above reasons, the projection portions remaining when the router machining is performed are preferably designed such that a length between their base portion and their inner end is 0.1 to 0.5 mm.

Then, as a second method of manufacturing the above electronic parts mounting substrate, there is provided a method of manufacturing an electronic parts mounting substrate, as defined in the invention of claim 4, in which in manufacture of an electronic parts mounting substrate having an insulating substrate in which a mount opening portion for mounting electronic parts thereat is formed and side-surface patterns having a plurality of potentials and provided on the wall surfaces of the mount opening portion, a large hole opened in the entire mount opening portion formation portion of the insulating substrate and having a wavy irregular portion at its periphery is formed in the mount opening portion formation portion, a metal plating film is then coated on a wall surface of the large hole, and thereafter convex portions of the irregular portion which project toward the interior of the large hole are cut by router machining to form the mount opening portion, and side-surfaces patterns having a plurality of potentials are formed on the wall surface of the mount opening portion, characterized in that projection portions that project toward the interior of the mount opening portion are formed in such a manner that portions of the convex portions of the irregular portion provided at the periphery of the large hole remain.

In the method of manufacturing according to the present invention, when the convex portions of the large hole are router-machined, portions of the convex portions remain, and the projection portions that project toward the interior of the mount opening portion are formed. With this structure, even if the metal plating film of the convex portion is drawn and peeled off by router machining, the peeling-off is restricted to the metal plating film that coats the side surfaces of the projection portion, and the metal plating film that covers the wall surface of the mount opening portion is not peeled off. Consequently, side-surface patterns which are in close contact with the wall surfaces of the mount opening portion can be formed.

Also, according to the present invention, for the same reason as aforementioned, high accuracy router machining is not required. Also, because the router machining is conducted at a position away from the mount opening portion, except for portions of the convex portions, the cutting can be made without damaging the mount opening portion, and the cutting is facilitated.

In this manufacturing method, as defined in the invention of claim 5, and for the above reasons, the above projection portions are preferably designed such that the length between their base portions and their inner end is 0.1 to 0.5 mm.

Next, according to the present invention a second means for solving the problem is directed to, as defined in the invention of claim 6, an electronic parts mounting substrate having an insulating substrate in which a mount opening portion for mounting electronic parts thereat is formed and side-surface patterns having a plurality of potentials and provided on the wall surfaces of the mount opening portion, characterized in that the side-surface patterns are formed by etching side-surface pattern non-formation portions of a conductive layer formed on all the wall surfaces of the mount opening portion in a state where the side-surface pattern formation portions are coated with a side-surface pattern resist film, and the respective side-surface patterns are insulated from each other by exposed surfaces provided between the patterns where portions of the insulating substrate are exposed by the etching.

In the electronic parts mounting substrate according to the present invention, the side-surface patterns are formed by etching the side-surface pattern non-formation portions of the conductive layer formed on the entire wall surface of the mount opening portion in a state where the side-surface pattern formation portions are coated with the side-surface pattern resist film. Accordingly, the pattern width of the side-surface pattern resist film is narrowed so that a clearance between the side-surface patterns can be narrowed to about 0.2 mm at the smallest.

The smallest clearances between the above respective side-surface patterns are remarkably narrower in size than the smallest clearance of about I mm in the conventional case where the projection portions or the punched portions are provided to insulate between the respective side-surface patterns. Hence, more side-surface patterns can be formed than in the conventional case. Therefore, various patterns with different potentials can be formed on the respective insulating substrates in correspondence with the number of the side-surface patterns, and thus the electronic parts mounting substrate can be made thinner.

Also, the side-surface patterns are formed by etching the conductive layer formed on all the wall surfaces of the mount opening portion. Consequently, the side-surface patterns are not peeled off due to the punching process as in the prior art.

In addition, the plurality of side-surface patterns are insulated from each other by the exposed surfaces provided between the respective patterns where portions of the insulating substrate are exposed by the above etching. The exposed surfaces between the respective patterns are exposed on substantially the same plane as the side-surface patterns.

Accordingly, the exposed surface provided between the surface of the side-surface patterns and only has a step as large as the thickness of the side-surface pattern which is formed of the conductive layer, and such thickness is only 10 to 30 m. Therefore, the side-surface patterns are situated on substantially the same plane as the exposed surfaces provided between the respective patterns.

Accordingly, there is no projection portion which becomes an obstacle when electronic parts are mounted on the substrate. As a result, the electronic parts can be smoothly mounted.

Also, as defined in the invention of claim 7, it is preferable that at least any one of upper and lower end portions of each the above side-surface patterns is connected to a side-surface pad along an end portion thereof.

Since the above side-surface pad is formed along the end portion of the side-surface pattern, the connection area where the side-surface pattern is connected to the side-surface pad is large. Therefore, the reliability of the connection between the side-surface pad and the side-surface pattern can be ensured, and a current supplied to the side-surface pattern can be readily led to the side-surface pad. Also, in general, a bonding pad for electrical connection of the electronic parts is disposed on the side-surface pad. With this structure, the side-surface pattern and the electronic parts can be electrically connected to each other through the above side-surface pad and the bonding pad.

Next, the invention of claim 8 is directed to a method of manufacturing an electronic parts mounting substrate having an insulating substrate in which a mount opening portion for mounting electronic parts thereat is formed and side-surface patterns having a plurality of potentials and provided on the wall surfaces of the mount opening portion, characterized in that the mount opening portion is opened on the insulating substrate, a conductive layer is formed on the entire surface of the insulating substrate including the wall surfaces of the mount opening portion, the surface of the conductive layer is coated with a side-surface pattern resist film made of a negative photosensitive resin, a side-sur-face pattern mask having slits for exposing a side-surface pattern non-formation portion on the wall surface of the mount opening portion is mounted on the surface of the insulating substrate, a scattered light is passed through the slits so that the scattered light is irradiated on the side-surface pattern non-formation portion to expose the side-surface pattern resist film that coats the side-surface pattern non-formation portion, the side-surface pattern resist film is developed to remove the side-surface pattern resist film that coats the side-surface pattern non-formation portions, the conductive layer exposed from the side-surface pattern resist film is removed by etching to form exposed surfaces between the respective patterns where portions of the insulating substrate are exposed at the side-surface pattern non-formation portions on the wall surface of the mount opening portion, and thereafter all of the side-surface pattern resist film that covers the surface of the conductive layer is removed to form side-surface patterns having a plurality of potentials which are insulated by the exposed surfaces provided between the patterns.

In the present invention, the most case must be paid to the process in which the scattered light is irradiated on the side-surface pattern resist film to expose the conductive layer formed on the side-surface pattern non-formation portions, the exposed conductive layer is removed by etching to form the exposed surfaces between the patterns, and also to form side-surface patterns having a plurality of potentials which insulated from each other by the exposed surfaces provided between the patterns.

In the present invention, exposure is made in a state where the side-surface pattern mask is mounted on the surface of the insulating substrate. The side-surface pattern mask has the slits for exposing the side-surface pattern non-formation portions at the mount opening portion.

With the above structure, when the exposure light is irradiated onto the side-surface pattern mask, the light passes through the slits and exposes the side-surface pattern resist film that coats the side-surface pattern non-formation portions. The side-surface pattern resist film-is made of a negative photosensitive resin. The negative photosensitive resin has properties according to which the exposed portions are dissolved by development, and the non-exposed portions are left. Also, the light for exposing the side-surface pattern resist film is a scattered light that scatters in all directions. The scattered light is reflected at various angles after passing through the slits so as to be irradiated onto the wall surfaces extending from the upper end portion of the mount opening portion to the lower end portion thereof.

Consequently, the side-surface pattern non-formation portions of the side-surface pattern resist film are exposed from the upper end portion of the mount opening portion to the lower end portion thereof and become removably dissolved by development.

Accordingly, the side-surface pattern non-formation portions of the side-surface pattern resist film are removed by subsequently developing the side-surface pattern resist film to expose the conductive layer from the removed portions. The exposed conductive layer is etched to remove the conductive layer at the side-surface pattern non-formation portions, thereby forming the exposed surface between the patterns on the wall surfaces of the mount opening portion. Thereafter, the remaining side-surface pattern resist film is removed so as to form the side-surface patterns having a plurality of potentials which are situated on substantially the same plane as the exposed surfaces provided between the patterns.

Also, the side-surface patterns are formed by etching the conductive layer formed on the wall surface of the mount opening portion in a state where the side-surface pattern formation portions are coated with the side-surface pattern resist film as described above. Therefore, if the pattern width of the side-surface pattern resist film is narrowed, the clearances between the side-surface patterns can be narrowed more than in the case where the side-surface patterns are insulated from each other by the-projection portions as in the above first means. More specifically, -the clearances between the side-surface patterns can be narrowed to about 0.2 mm at the smallest. Consequently, more side-surface patterns than in the first means can be formed.

Therefore, according to the present invention, various patterns with different potentials can be formed on the respective insulating substrates in correspondence with the number of the side-surface patterns, and thus can be made thinner the electronic parts mounting substrate.

Also, the side-surface patterns are formed by etching the conductive layer formed on the wall surfaces of the mount opening portion. Therefore, peeling-off of the side-surface patterns due to the punching process does not occur as in the prior art. Also, the plurality of side-surface patterns can be formed on the same plane as the wall surface of the mount opening portion without forming any projection portions on the wall surface of the mount opening portion as in the first means. As a result, can be formed a mount opening portion which is capable of smoothly mounting the electronic parts without the projection portions obstructing the mounting of the electronic parts can be formed.

Next, as defined in the invention of claim 9, it is preferable that a wiring pattern resist film for forming wiring patterns is coated on the surface of the insulating substrate after all of the side-surface pattern resist films is removed, and the conductive layer that coats the surface of the insulating substrate then be etched to form the wiring patterns on the surface of the insulating substrate. With this arrangement, the wiring patterns can be formed on the upper surface or the lower surface of the insulating substrate.

Also, so long as the slits formed in the side-surface pattern mask are shaped to irradiate the scattered light onto the side-surface pattern non-formation portion on the wall surfaces of the-mount opening portions, their shape is not limited.

For example, as in the invention of claim 10, it is preferable that the slits are comprised of a wall-surface exposure portion for exposing the side-surface pattern non-formation portion on the wall surface of the mount opening portion and a peripheral edge exposure portion for exposing the side-surface pad non-formation portion in the vicinity of the edge portion of the mount opening portion.

In this case, not only the side-surface pattern non-formation portions of the side-surface pattern resist film, but also the mount opening portion in the vicinity of the edge portions of the side-surface pattern non-formation portions are exposed by the irradiation of the scattered light. Accordingly, the development of the side-surface pattern resist film and the etching of the conductive layer are thereafter conducted as described above, whereby the exposed surfaces between the patterns are formed on the side-surface pattern non-formation portions, and exposed surfaces between the pads which are continuous to the exposed surfaces between the above-mentioned patterns are formed in the vicinity of the edge portion of the side-surface pattern non-formation portions. Therefore, the side-surface pads corresponding to the respective side-surface patterns can be formed together with the formation of the side-surface patterns.

BRIEF DESCRIPTION OF THE DRAWINGS

FIG. 12 is a plan view showing the insulating substrate in the embodiment 4;

FIG. 13 is a back view showing the insulating substrate in the embodiment 4;

Figure 1:
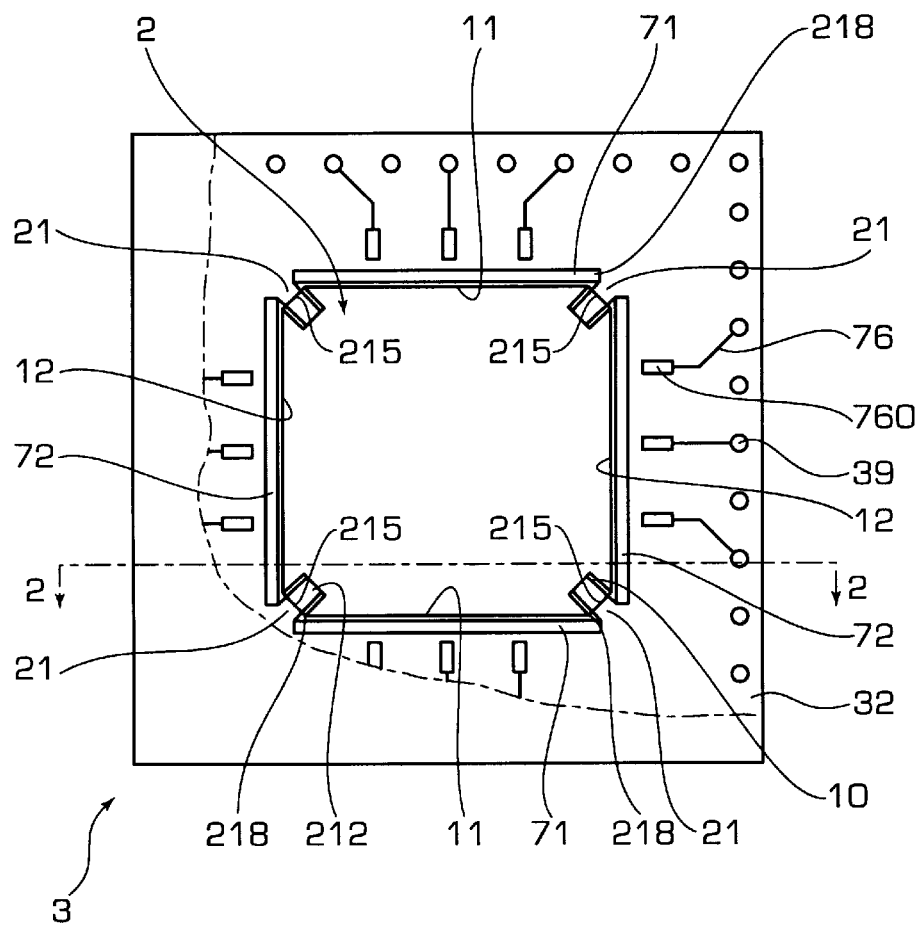
FIG. 1 is a plan view showing an electronic parts mounting substrate according to an embodiment 1.

DESCRIPTION OF REFERENCE NUMERALS 11, 12, 51 . . . side-surface pattern
2, 73 . . . mount opening portion
21, 22 . . . projection portion
218 . . . corner
29 . . . plane portion
201, 202, 203 . . . partition hole
205 . . . large hole
210, 211, 213 . . . partition wall
219, 230 . . . center portion
3, 30 . . . electronic parts mount substrate
31, 32, 7 . . . insulating substrate
4 . . . scattered light
40 . . . side-surface pattern mask
41 . . . slit
5 . . . conductive layer
52, 71, 72 . . . side-surface pad
520, 550, 760 . . . bonding pad
6 . . . side-surface pattern resist film
731 . . . exposed surface between patterns
732 . . . exposed surface between pads
76, 79, 55, 56 . . . wiring pattern
8 . . . electronic parts

BEST MODE FOR CARRYING OUT THE INVENTION

EMBODIMENT 1

A description will be given of an electronic parts mounting substrate according to an embodiment of the present invention with reference to FIGS. 1 to 5.

Figure 2:
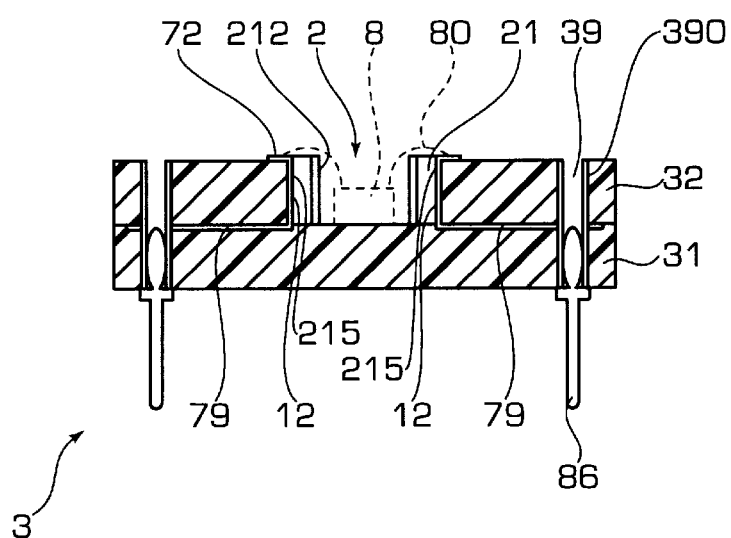
FIG. 2 is a cross-sectional view taken along a line F—F of FIG. 1.

As shown in FIGS. 1 and 2, an electronic parts mounting substrate 3 of this example includes insulating substrates 31 and 32, a mount opening portion 2 for mounting electronic parts 8 thereat, and side-surface patterns having a plurality of potentials 11 and 12 provided on the wall surfaces of the mount opening portion 2.

Figure 5:
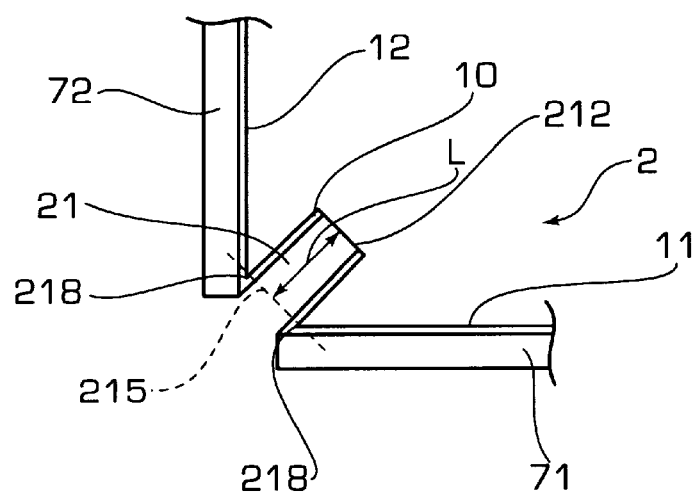
FIG. 5 is a plan view showing an essential portion of the electronic parts mounting- substrate according to the embodiment 1.

At corners 218 of the mount opening portion 2 are disposed projection portions 21 that project from the wall surface thereof toward the interior of the mount opening portion 2. End portions of the respective side-surface patterns 11 and 12 extend to the side surfaces of the projection portions 21. As shown in FIG. 5, a length L of the projection portion 21 extending from a base portion 215 to an inner end 212 is 0.5 mm.

The side-surface pattern 11 and the side-surface pattern 12 are alternately disposed on the wall surfaces of the mount opening portion 2 as shown in FIG. 1. The side-surface pattern 11 is a power supply circuit that supplies electricity to the electronic parts, and the side-surface pattern 12 is grounding circuit for grounding the electronic parts. The side-surface patterns 11 and 12 are connected thereof at upper portions to band-like side-surface pads 71 and 72 that surround the mount opening portion 2.

Also, as shown in FIG. 2, the grounded side-surface pattern 12 is connected to a grounded wiring pattern 79 disposed between the insulating substrates 31 and 32 at a lower portion thereof. The power supply side-surface pattern 11 is connected to a power supply wiring pattern (omitted in the figure) disposed between the insulating substrates 31 and 32.

Also, on the upper surface of the insulating substrate 32 which is an upper layer a signal wiring pattern 76 and a bonding pad 760 disposed at an end of the wiring pattern 76 are provided as shown in FIG. 1. The wiring pattern 76 is connected to through-holes 39 that pass through the electronic parts mounting substrate 3. Inside of the through-hole 39 is disposed, for example, a lead pin 86 as shown in FIG. 2. The electronic parts 8 mounted at the mount opening portion 2 are electrically connected to the side-surface pads 71, 72 and the bonding pad 760 through bonding wires 80.

Subsequently, a method of manufacturing the above electronic parts mounting substrate will be described.

First, two insulating substrates are prepared. The insulating substrate to be used is a glass epoxy resin substrate, a glass polyimide resin substrate, a glass bismaleimidotriazine resin substrate or the like.

Figure 3:
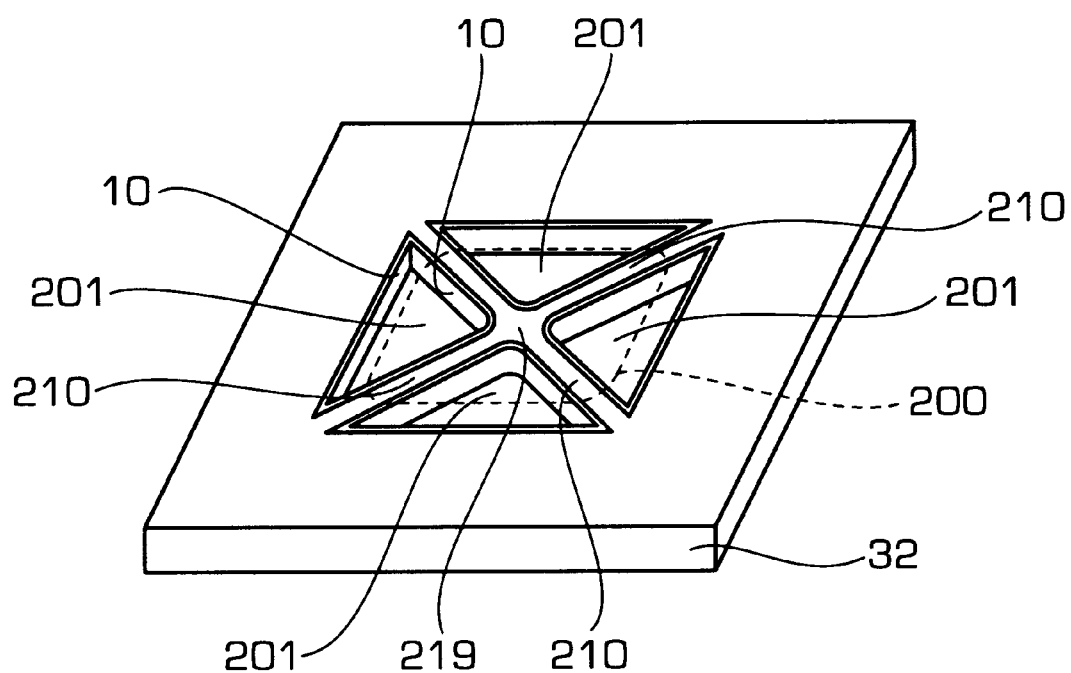
FIG. 3 is a perspective view showing an insulating substrate to explain a method of forming side-surface through-holes at a wall surface of a mount opening portion in the embodiment 1.

Then, as shown in FIG. 3, a plurality of partition holes 201 that have the side-surface pattern formation portions as portions of the wall surfaces are formed in the mount opening portion formation portion of the insulating substrate 32 which will form the upper layer by deforming the respective partition holes 201 with partition walls 210 by router machining or a punching process.

The partition holes 201 are sectioned into four holes with the cross-shaped partition walls 210 which are transverse to the mount opening portion formation portion. Each of the partition holes 201 is triangular with the side-surface pattern formation portion as one side, and one corner thereof opposite a center portion 219 of the partition wall 210.

Then, a metal plating film 10 made of copper is coated on the walls surface of the above partition holes 201.

Figure 4:
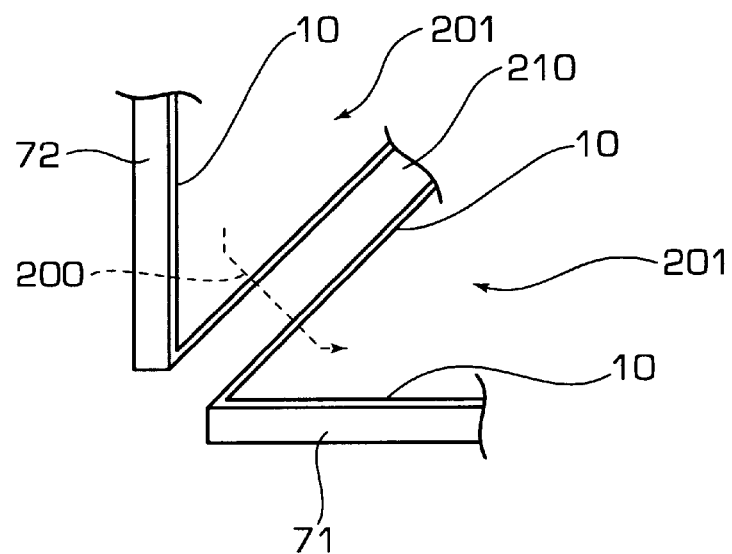
FIG. 4 is an explanatory diagram showing a cutting position for partition walls between the respective partition holes in the embodiment 1.

Subsequently, the partition walls 210 of the partition holes 201 is cut off along a dotted line 200 as shown in FIGS. 3 and 4 by router machining. In this process, as shown in FIG. 5, portions of the partition walls 210 remain so as to form the projection portions 21 that project toward the interior of the mount opening portion 2. With this structure, as shown in FIG. 1, the mount opening portion 2 and the side-surface patterns 11 and 12 are formed on the wall surfaces of the mount opening portion 2.

Subsequently, the operation and effects of this example will be described.

As shown in FIGS. 1 and 5, the electronic parts mounting substrate 3 of this example has the projection portions 21 that project toward the interior of the mount opening portion 2 at both ends of the side-surface patterns 11 and 12. The metal plating films 10 that are the end portions of the respective side-surface patterns 11 and 12 extend to the side surfaces of each the projection portions 21. With this arrangement, even if the end portion of a side-surface pattern 11 is peeled off, the peeling-off is restricted to only the end portions of the side-surface patterns 11 and 12 that coat the side surfaces of the projection portion 21. Therefore, the side-surface patterns 11 and 12 are not peeled off from the wall surfaces of the mount opening portion 2. Further, the side-surface patterns 11 and 12 are not peeled off from the wall surfaces of the mount opening portion 2 even if they are subjected to thermal shock. Therefore, the electric conductivity of the side-surface patterns can be ensured.

Also, in the manufacturing method according to this example, as shown in FIGS. 4 and 5, when the partition wall 210 of the partition hole 201 is subjected to the router machining, portions of the partition wall 210 remain so as to form the projection portions 21 that project toward the interior of the mount opening portion 2. Therefore, even if the metal plating film 10 of the partition wall 210 is peeled off by the router machining, the peeling-off is restricted to only the metal plating film 10 that coats the side surfaces of the projection portions 21, and the metal plating film 10 that coats the wall surfaces of the mount opening portion 2 is not peeled off. Therefore, the side-surface patterns 11 and 12 which have a plurality of potentials and are firmly adhered to the wall surfaces of the mount opening portion 2 can be formed.

Also, even if the metal plating film 10 is peeled off at the projection portion after the cutting process is performed, since the peeling-off is blocked at the projection portions 21, the highly accurate router machining is not required. Also, because the router machining is performed at a position away from the wall surfaces of the mount opening portion 2 in such a manner that portions of the partition walls between the partition holes 201 remain, the cutting process can be performed without damaging the metal plating film 10 that coats the wall surfaces of the mount opening portion with the blade of the router machining tool.

Also, as shown in FIGS. 4 and 5, because the cutting process is performed in such a manner that portions of the partition walls 210 of the partition holes 201 remain, even the corners 218 of the mount opening portions which are particularly difficult to cut are readily cut, and the side-surface patterns 11 and 12 having a plurality of potentials can be formed.

EMBODIMENT 2

Figure 6:
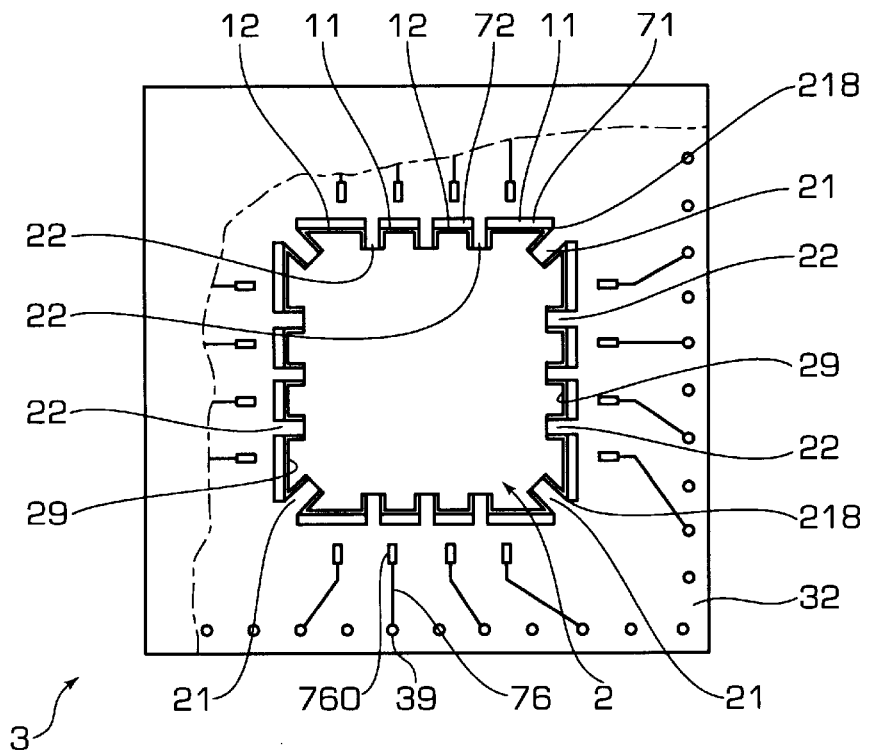
FIG. 6 is a plan view showing an electronic parts mounting substrate according to an embodiment 2.

An electronic parts mounting substrate of this example includes not only projection portions 21 that project from the corners 218 of the mount opening portion 2, but also projection portions 22 that project at a right angle from the plane portions 29 of the mount opening portion 2 as shown in FIG. 6.

The power supply side-surface patterns 11 and the grounded side-surface patterns 12 are alternately disposed between the respective projection portions 21 and 22. The band-like side-surface pads 71 and 72 are disposed on the upper surface of the insulating substrate 32 which is situated above the respective side-surface patterns 11 and 12, and the wiring patterns are disposed on the lower surface of the insulating substrate 32 which is situated below the respective side-surface patterns 11 and 12.

Figure 7:
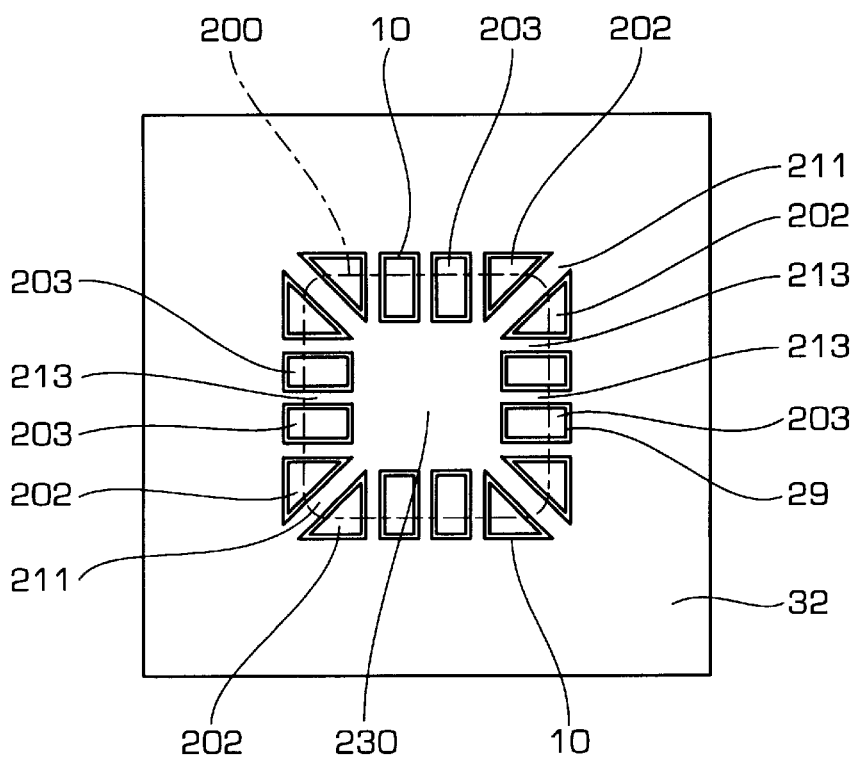
FIG. 7 is a perspective view showing an insulating substrate to explain a method of forming side-surface through-holes at a wall surface of a mount opening portion in the embodiment 2.

In manufacturing of the above electronic parts mounting substrate 3, as shown in FIG. 7, a plurality of partition holes 202 and 203 having the side-surface pattern formation portions as a part of the wall surfaces are formed by router machining or a punching process in the mount opening portion formation portion of the insulating substrate 32 which will form the upper layer.

The partition holes 202 and 203 are formed in the peripheral portion of the mount opening portion formation portion. The partition holes 202 are triangular, and two partition holes 202 are formed at each of the four corners of the mount opening portion formation portion so as to sandwich the partition walls 211. The partition holes 203 are rectangular, and two partition holes 203 are formed at each of the plane portions 29 of the mount opening portion formation portion so as to sandwich the partition walls 213. The partition walls 211 and 213 are connected to the center portion 230 of the mount opening portion formation portion.

After the metal plating film 10 is coated on the wall surfaces of the partition holes 202 and 203, partition walls 211 and 213 of the above-mentioned partition holes are cut off along dotted line 200 shown in FIG. 7 by router machining. In this process, the projection portions 21 and 22 that project toward the interior of the mount opening portion 2 are formed in such a manner that portions of partition walls 211 and 213 remain.

The projection portions 21 and 22 are designed such that the lengths of the projection portions 21 and 22 extending from the base to the inner end thereof are set to 0.5 mm and 0.3 mm, respectively. With this structure, as shown in FIG. 6, the mount opening portion 2 is formed, and the side-surface patterns 11 and 12 having a plurality of potentials and the projection portions 21 and/or 22 at both ends thereof are formed.

Other structures are identical to those of embodiment 1. In this example, the same effects as those of embodiment 1 can be obtained.

EMBODIMENT 3

Figure 8:
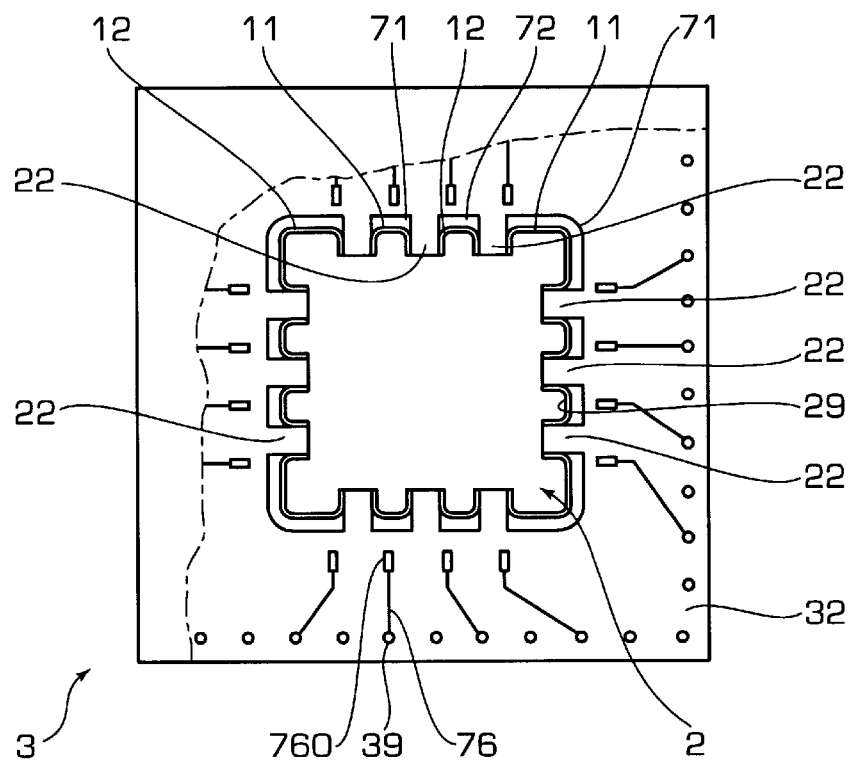
FIG. 8 is a plan view showing an electronic parts mounting substrate according to an embodiment 3.

An electronic parts mounting substrate of this example includes a plurality of projection portions 22 that project at a right angle from the plane portions 29 of the wall surfaces of the mount opening portion 2 as shown in FIG. 8.

The power supply side-surface patterns 11 and the grounded side-surface patterns 12 are alternately disposed between the respective projection portions 22. The band-like side-surface pads 71 and 72 are disposed on the upper surface of the insulating substrate 32 which is situated above the respective side-surface patterns 11 and 12, and the wiring patterns are disposed on the lower surface of the insulating substrate 32 which is situated below the respective side-surface patterns 11 and 12.

Figure 9:
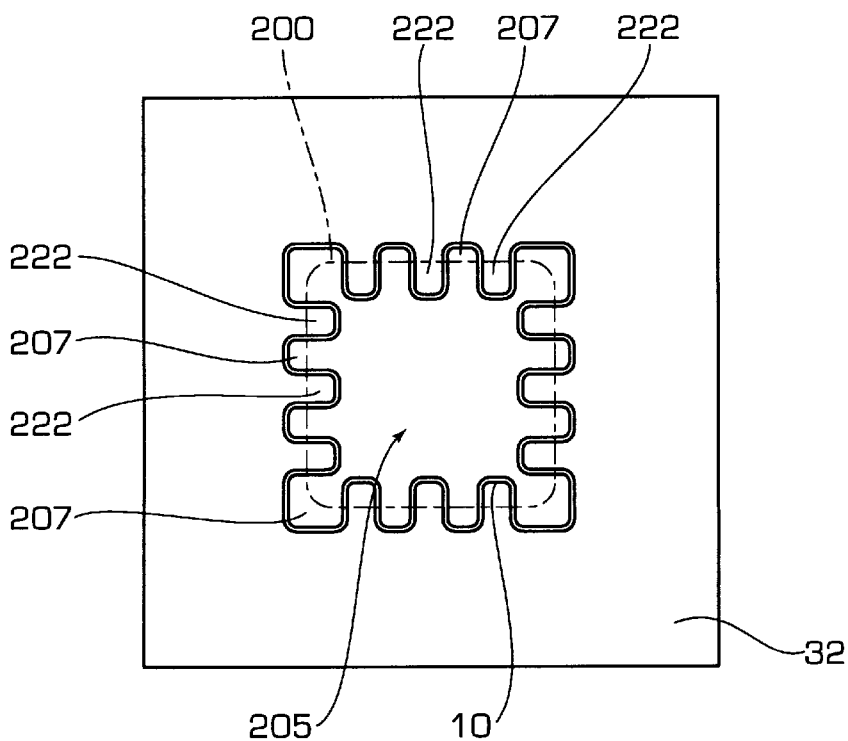
FIG. 9 is a perspective view showing an insulating substrate to explain a method of forming side-surface through-holes at a wall surface of a mount opening portion in the embodiment 3.

In manufacturing the above electronic parts mounting substrate 3, as shown in FIG. 9, a large hole 205 that opens the entire mount opening portion formation portion is formed in the mount opening portion formation portion of the insulating substrate 32, which will form the upper layer, by router machining or a punching process. The large hole 205 includes wavy irregular portions 207 at its periphery. A plurality of convex portions 222 project from the insulating substrate 32 at right angles at the irregular portion 207.

After the metal plating film 10 is coated on the wall surface of the large hole 205, the convex portions 222 are cut off along a dotted line 200 shown in FIG. 9 by router machining. In this process, the projection portions 22 that project toward the interior of the mount opening portion 2 are formed in such a manner that portions of the convex portions 222 remain. As a result, as shown in FIG. 8, the mount opening portion 2 is formed, and the side-surface patterns 11 and 12 having a plurality of potentials are formed.

Other structures are identical with those of embodiment 1. In this example as well, the same effects as those of embodiment 1 can be obtained.

EMBODIMENT 4

A description will be given of an electronic parts mounting substrate according to an embodiment of the present invention with reference to FIGS. 10 to 25.

Figure 10:
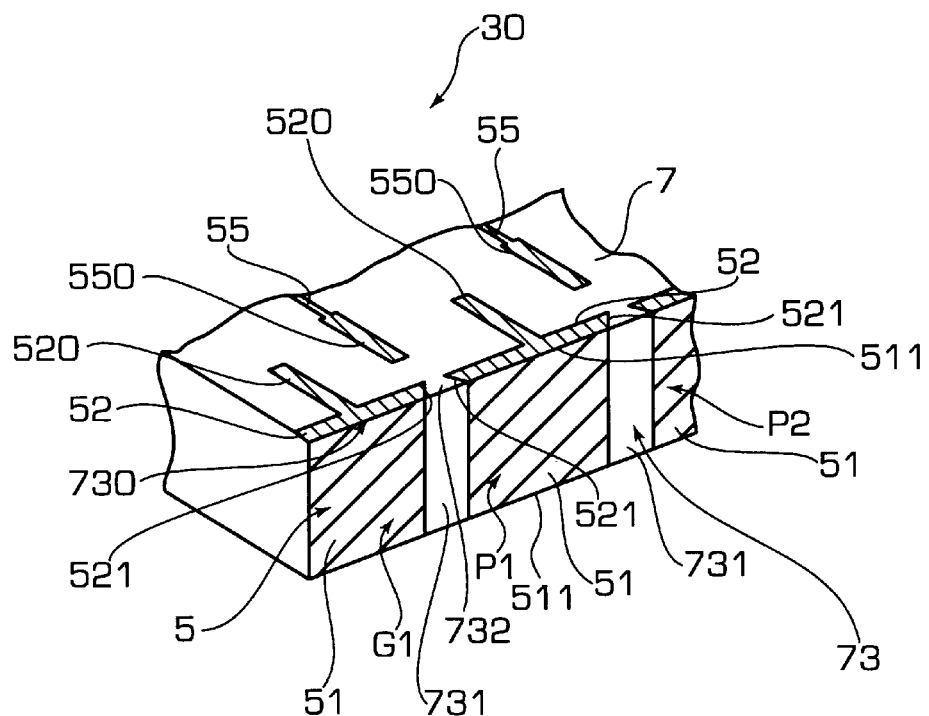
FIG. 10 is a partial perspective view showing an electronic parts mounting substrate having side-surface patterns formed on a wall surface of the mount opening portion in an embodiment 4.

An electronic parts mounting substrate 30 according to this example includes, as shown in FIG. 10, an insulating substrate 7 having a mount opening portion 73 for mounting electronic parts thereat and the side-surface patterns 51 having a plurality of potentials disposed on the wall surfaces of the mount opening portion 73.

The side-surface patterns 51 are formed by etching side-surface -pattern non-formation portions of a conductive layer 5 formed on the wall surfaces of the mount opening portion 73 in a state where the side-surface pattern formation portions are coated. The respective side-surface patterns 51 are insulated from each other by exposed surfaces 731 provided between the patterns where portions of the insulating substrate 7 are exposed by etching. The side-surface patterns 51 are disposed on substantially the same plane as the exposed surface 731 between the patterns.

The upper and lower end portions 511 of the side-surface patterns 51 are connected to side-surface pads 52 along the end portions thereof. The side end portions of each of the side-surface pads 52 has a tapered portion 521 which expands from the edge portion 730 of the mount opening portion 73 toward the exterior of the mount opening portion 73. The respective side-surface pads 52 are insulated from each other by the exposed surfaces 732 between the pads, which is nearly triangular, with the tapered portion 521 as one side.

Figure 11:
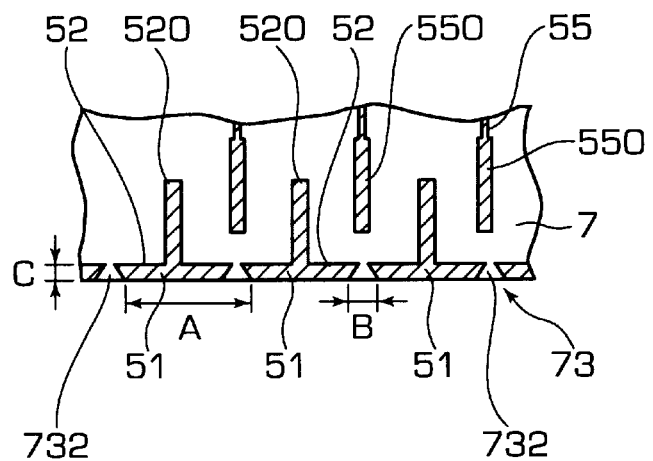
FIG. 11 is a partial plan view showing an insulating substrate having an opening portion peripheral edge of the mount opening portion in the embodiment 4.

As shown in FIGS. 10 and 11, a pitch A of the side-surface pattern 51 is set to 0.54 mm. A clearance between the adjacent side-surface patterns 51 is set to 0.2 mm. A width C of the side-surface pad 52 is set to 100 to 150 m. When the width C is smaller than 100 m, there is a risk that the side-surface pad will be difficult to form. When the width C exceeds 150 m, there is a risk that bonding pads 550 of the wiring patterns 55 will be damaged.

Also, as shown in FIGS. 10 to 13, the wiring patterns 55 and 56 are formed on the upper surface and the lower surface of the insulating substrate 7, respectively. As shown in FIG. 12, each of the wiring patterns 55 formed on the upper surface of the insulating substrate 7 has a bonding pad 550 in the periphery of the mount opening portion 73. As shown in FIG. 13, the wiring patterns 56 formed on the lower surface of the insulating substrate 7 is a wide flat layer and is connected to the side-surface patterns 51 shown in FIG. 10. The side-surface pattern 51 is connected to the side-surface pad 52 and the bonding pad 520 provided on the upper surface of the insulating substrate 7.

Also, as shown in FIG. 12, the wiring patterns 55 and the bonding pads 550 formed on the upper surface of the insulating substrate 7 are made up of signal circuits S1, S2, . . . Sx with different potentials (x indicates the number of signal circuits, and applies hereinafter).

As shown in FIG. 13, the wiring-patterns 56 formed on the lower surface of the insulating substrate 7 are made up of power supply circuits P1, P2, . . . Py with different potentials (y indicates the number of power supply circuits, and applies hereinafter), and grounded circuits G1, G2, . . . Gz (z indicates the number of grounded circuits, and applies hereinafter). The side-surface patterns 51 connected to those wiring patterns 56 are made up of the power supply circuits P1, P2, . . . Py and the grounded circuits G1, G2, . . . Gz which correspond to the respective wiring patterns. Also, the side-surface pads 52 and the bonding pads 520 which are connected to the respective side-surface patterns are also made up of circuits of the same type.

Figure 14:
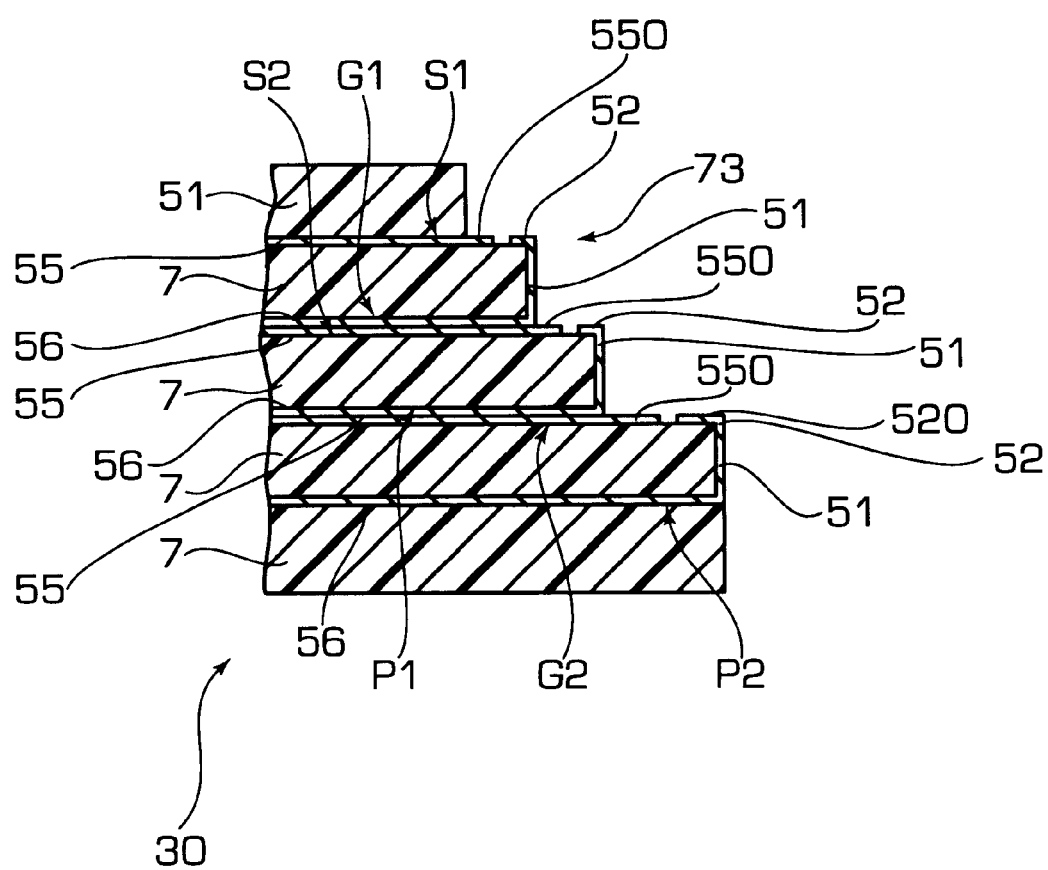
FIG. 14 is a cross-sectional view showing a multi-layer electronic parts mounting substrate in the embodiment 4.

As shown in FIG. 14, a plurality of insulating substrates 7 are laminated to form an electronic parts mounting substrate 30 with a multi-layer structure.

Next, a method of manufacturing the above-mentioned electronic parts mounting substrate will be described.

Figure 15:
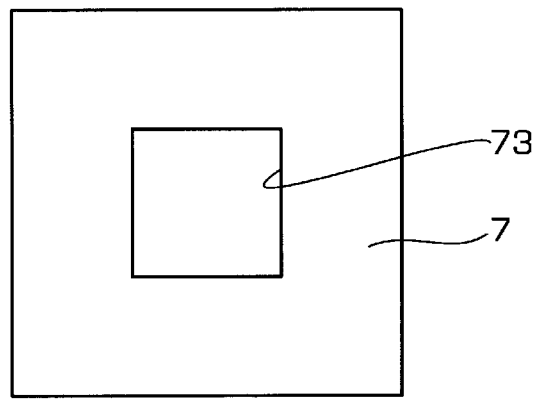
FIG. 15 is a plan view showing the insulating substrate in which the mount opening portion is punched in the embodiment 4.

First, an insulating substrate formed of a glass bismale-imidotriazine substrate is prepared. As shown in FIG. 15, the mount opening portion 73 is opened in the insulating substrate 7 by router machining. Also, as shown in FIGS. 12 and 13, through-holes 78 are opened in the vicinity of the peripheral edge of the insulating substrate 7.

Figure 16:
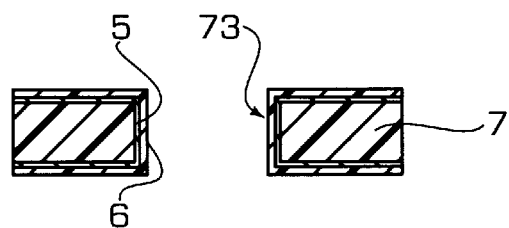
FIG. 16 is a cross-sectional view showing the insulating substrate that covers the conductive layer and a side-surface pattern resist film.

Then, as shown in FIG. 16, the insulating substrate 7 is subjected to an electroless copper plating process to form the conductive layer 5 on the entire surface of the insulating substrate 7 including the interior of the mount opening portion 73.

Subsequently, the entire surface of the conductive layer 5 is coated with a side-surface pattern resist film 6 made of a negative photosensitive resin by an electrodeposition coating process.

Figure 17:
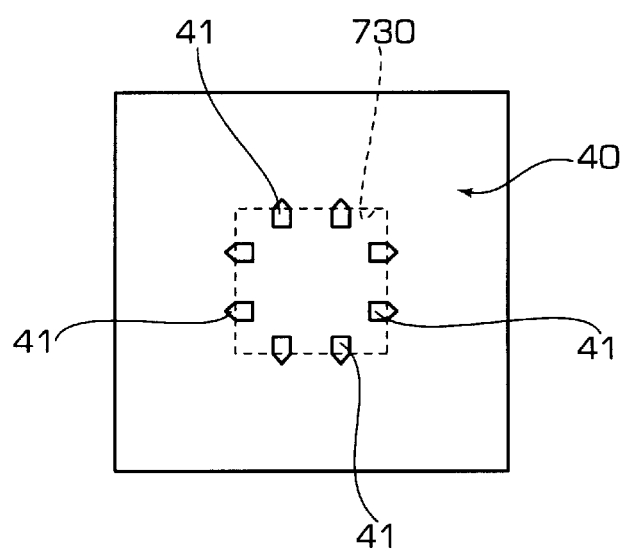
FIG. 17 is a plan view showing a side-surface pattern mask in the embodiment 4.
Figure 18:
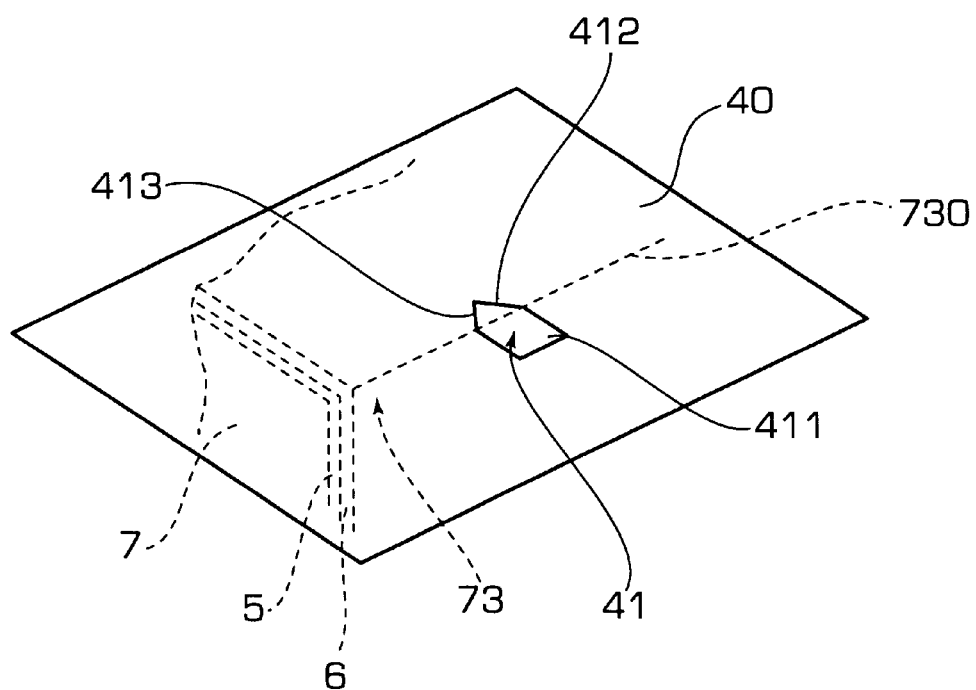
FIG. 18 is a perspective view showing the insulating substrate covered with the side-surface pattern mask in the vicinity of the mount opening portion.

Then, as shown in FIGS. 17 and 18, a side-surface pattern mask 40 is mounted on the upper surface and the lower surface of the insulating substrate 7. The side-surface pattern mask 40 has slits 41 for exposing the side-surface-pattern non-formation portions at portions where the mount opening portion 73 of the insulating substrate 7 is coated. The slit 41 is made up of, as shown in FIG. 18, a wall-surface exposure portion 411 for exposing the side-surface pattern non-formation portion and a peripheral edge exposure portion 412 for exposing the side-surface pad non-formation portion.

The wall-surface exposure portion 411 is open in the interior of the mount opening portion 73 so that an exposure light reaches the lower edge portion 730 of the mount opening portion 73 from the upper edge portion 730 thereof. The peripheral edge exposure portion 412 is open at the side-surface pad non-formation portion in the vicinity of the edge portion 730 of the mount opening portion 73. Also, the peripheral edge exposure portion 412 is defined by a portion surrounded by the edge portion 730 of the mount opening portion 73 and an oblique side which is reduced from the edge portion 730 toward the exterior of the mount opening portion 73, and has a triangular shape.

Figure 19:
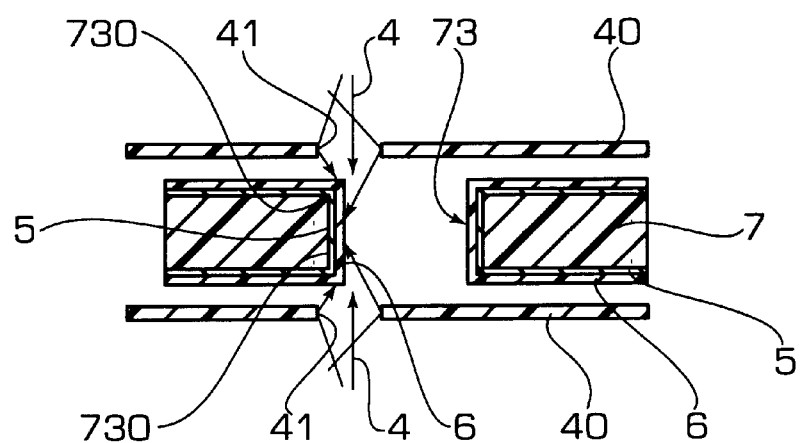
FIG. 19 is a cross-sectional view of the insulating substrate showing a method of exposing the side-surface pattern resist film in the embodiment 4.

Then, as shown in FIG. 19, the side-surface pattern non-formation portion of the side-surface pattern resist film 6 is exposed by a scattered light 4 which is scattered in all directions.

The scattered light 4 is reflected by the side-surface pattern resist film 6 on the insulating substrate surface at various angles after passing through the slit 41 so as to be irradiated on the wall surfaces of the mount opening portion 73 and its periphery.

With this structure, the scattered light 4 is uniformly irradiated onto the side-surface pattern non-formation portion of the side-surface pattern resist film 6 from the upper edge portion 730 of the mount opening portion 73 to the lower edge portion 730. Also, the scattered light 4 is uniformly irradiated on the side-surface pattern resist film 6 in the vicinity of the edge portion 730 of the mount opening portion 73. As a result, a portion of the side-surface pattern resist film 6 on which the scattered light 4 is irradiated is sensitized, and removably dissolved by development.

Then, the side-surface pattern mask 40 is removed.

Figure 20:
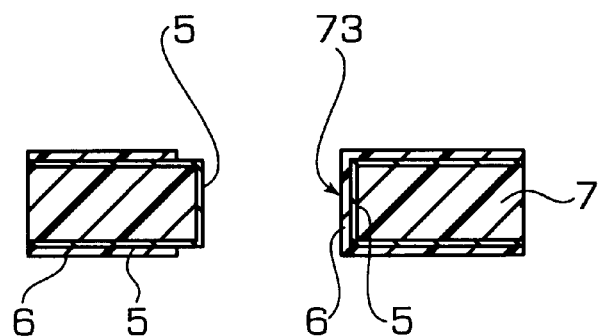
FIG. 20 is a cross-sectional view showing the insulating substrate from which the side-surface pattern non-formation portions of the side-surface pattern resist film are removed in the embodiment 4.
Figure 21:
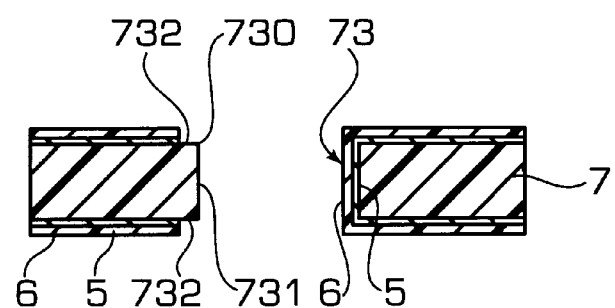
FIG. 21 is a cross-sectional view showing the insulating substrate on which exposed surfaces between patterns are formed on the wall surface of the mount opening portion in the embodiment 4.

Thereafter, as shown in FIG. 20, the side-surface pattern resist film 6 is developed to remove the side-surface pattern non-formation portion and the side-surface pad non-formation portion. Then, as shown in FIG. 21, the conductive layer 5, exposed from the side-surface pattern resist film 6, is removed by etching. With this process, the exposed surfaces 731 between the patterns where portions of the insulating substrate 7 are exposed are formed on the wall surfaces of the mount opening portion 73. Also, the exposed surfaces 732 between the pads, which have a triangular shape that narrows toward the exterior of the mount opening portion 73, are formed in the vicinity of the opening portion 730 of the mount opening portion 73 so as to be continuous with the exposed surfaces 731 provided between the above-mentioned patterns.

Figure 22:
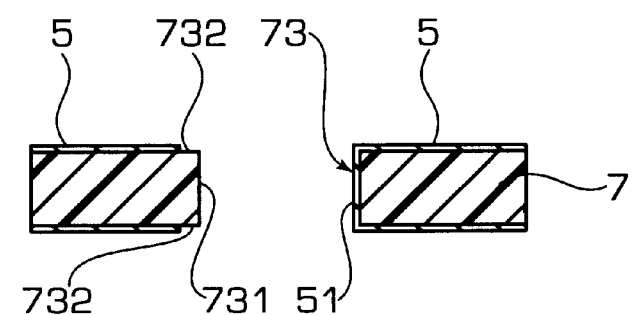
FIG. 22 is a cross-sectional view showing the insulating substrate on which the side-surface patterns are formed in the embodiment 4.
Figure 23:
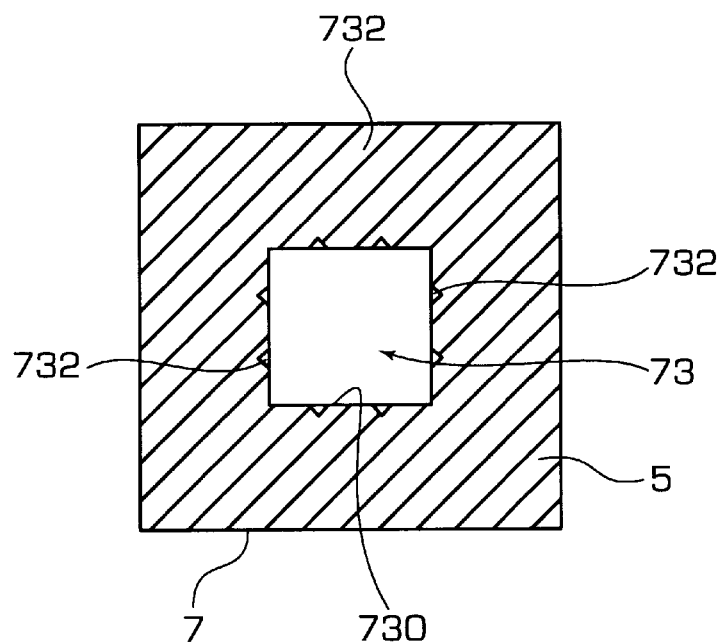
FIG. 23 is a plan view showing the insulating substrate on which the side-surface patterns are formed in the embodiment 4.
Figure 24:
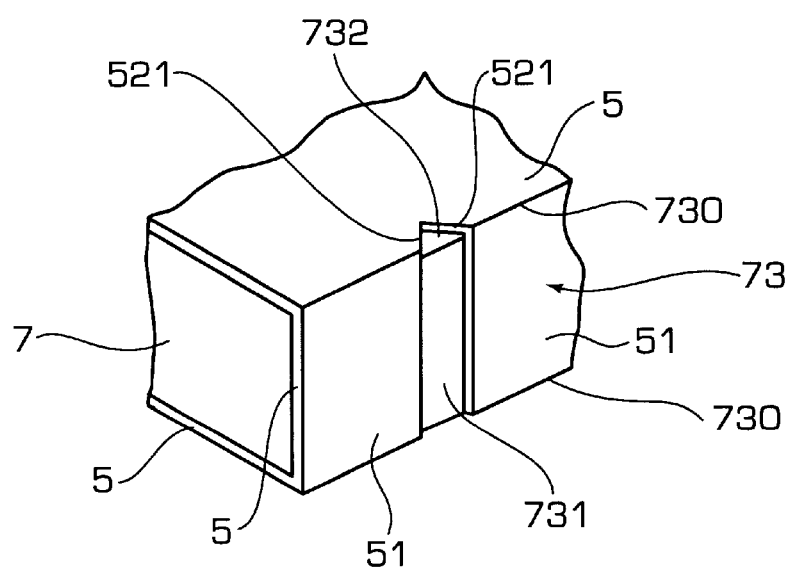
FIG. 24 is a perspective view showing the interior of the mount opening portion on which the side-surface patterns are formed in the embodiment 4.

Then, the side-surface pattern resist film 6 which remains on the surface of the conductive layer 5 is removed with an alkali solution. As a result, as shown in FIGS. 22 to 24, the side-surface patterns 51 insulated from each other by the exposed surfaces 731 between the patterns of the mount opening portion 73 are formed on substantially the same plane as the exposed surfaces 731 between the patterns. In this situation, a portion surrounded by the tapered portion 521 which will form the side end portion of the side-surface pad is exposed on the upper surface and the lower surface of the insulating substrate 7. Then, the entirety of upper and lower surfaces of the insulating substrate 7 are coated with the conductive layer 5 as they are, except for the exposed surfaces 732 between the pads which are formed between the tapered portions 521.

Figure 25:
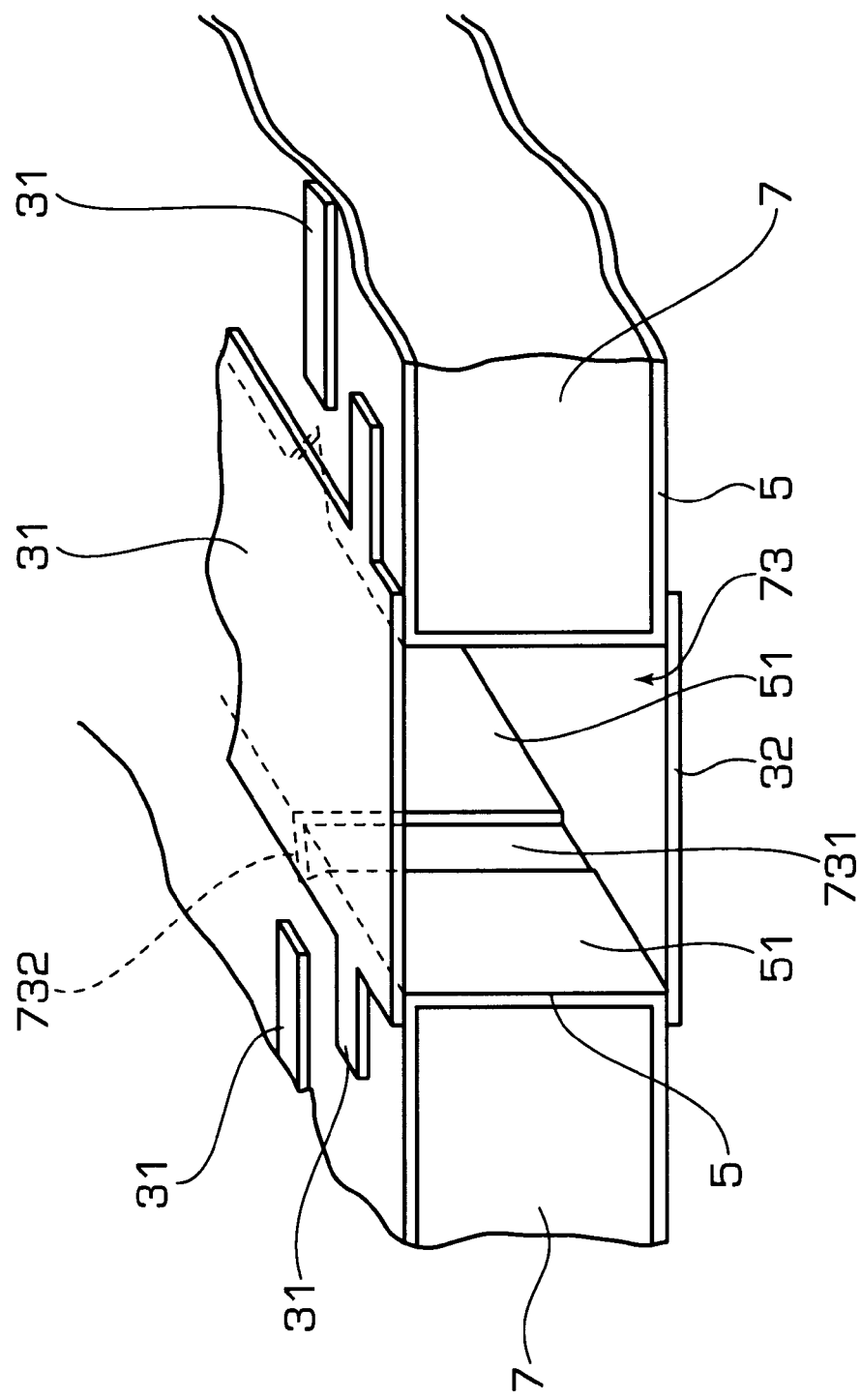
FIG. 25 is a perspective view of the insulating substrate in the vicinity of the mount opening portion showing a method of forming wiring patterns in the embodiment 4.

Subsequently, as shown in FIG. 25, the wiring pattern masks 31 and 32 for forming the wiring patterns and the side-surface pads are mounted on the upper surface and the lower surfaces of the insulating substrate 7 so as to be coated on the wiring pattern formation portion-and the mount opening portion 73.

Then, the portions of the conductive layer 5 which are exposed from the wiring pattern masks 31 and 32 are removed by etching. Subsequently, the wiring pattern masks 31 and 32 are removed. As a result, as shown in FIGS. 10 to 13, the side-surface pads 52 continuous with the upper and lower end portions 511 of the above-mentioned side-surface patterns 51, and the wiring patterns 55, 56 are formed on the upper surface and the lower surface of the insulating substrate 7.

Thereafter, as shown in FIG. 14, a plurality of the above-described insulating substrates 7 are laminated and crimped to obtain a multi-layer electronic parts mounting substrate 30.

Next, the operation and effect of the embodiment of the present invention will be described.

The side-surface patterns are formed, as shown in FIG. 21, by etching the side-surface pattern non-formation portions of the conductive layer 5 formed on the wall surfaces of the mount opening portion 73 in a state where the side-surface pattern formation portions are coated with the side-surface pattern resist film 6. Therefore, if the pattern width of the side-surface pattern resist film 6 is narrowed, the clearances between the side-surface patterns can be narrowed to about 0.2 mm. Consequently, as shown in FIG. 10, more side-surface patterns 51 than in the embodiment 1 can be formed.

Therefore, as shown in FIG. 14, various wiring patterns 51 with different potentials can be formed in correspondence with the number of the wiring patterns 55 and 56 disposed on the upper surface and the lower surface of the insulating substrate 7. Therefore, circuits having various potentials can be formed between the upper surface and the lower surface of the insulating substrate 7. As a result, the electronic parts mounting substrate 30 can have high density packing and be made thin. Also, in the electronic parts mounting substrate (refer to FIG. 1) where the respective side-surface patterns are insulated by the projection portions according to the embodiment 1, the circuit function that requires a nine-layer insulating substrate becomes a six-layer insulating substrate according to this example because the side-surface patterns can be packaged with high density.

Also, the side-surface patterns 51 are formed by etching the conductive layer 5 formed on the wall surfaces of the mount opening portion 73. Therefore, the side-surface patterns are not peeled off by the punching process as in the prior art.

Further, as shown in FIG. 10, the side-surface patterns 51 are insulated from each other by the exposed surfaces 731, which are exposed on substantially the same plane as that of side-surface patterns 51, provided between the patterns of the mount opening portion 73. Therefore, no projection portions are provided on the wall surfaces of the mount opening portion 73. Hence, the electronic parts can be smoothly mounted.

Also, because the side-surface pads 52 are formed along the upper and lower end portions 511 of the side-surface patterns 51, the connection area of the side-surface pads 52 to the side-surface patterns 51 is large, and the reliability of connection of both the pads and patterns is high. Therefore, the side-surface pads 52 enable a current supplied to the side-surface patterns 51 to be readily led to the bonding pads 520.

EMBODIMENT 5

Figure 26:
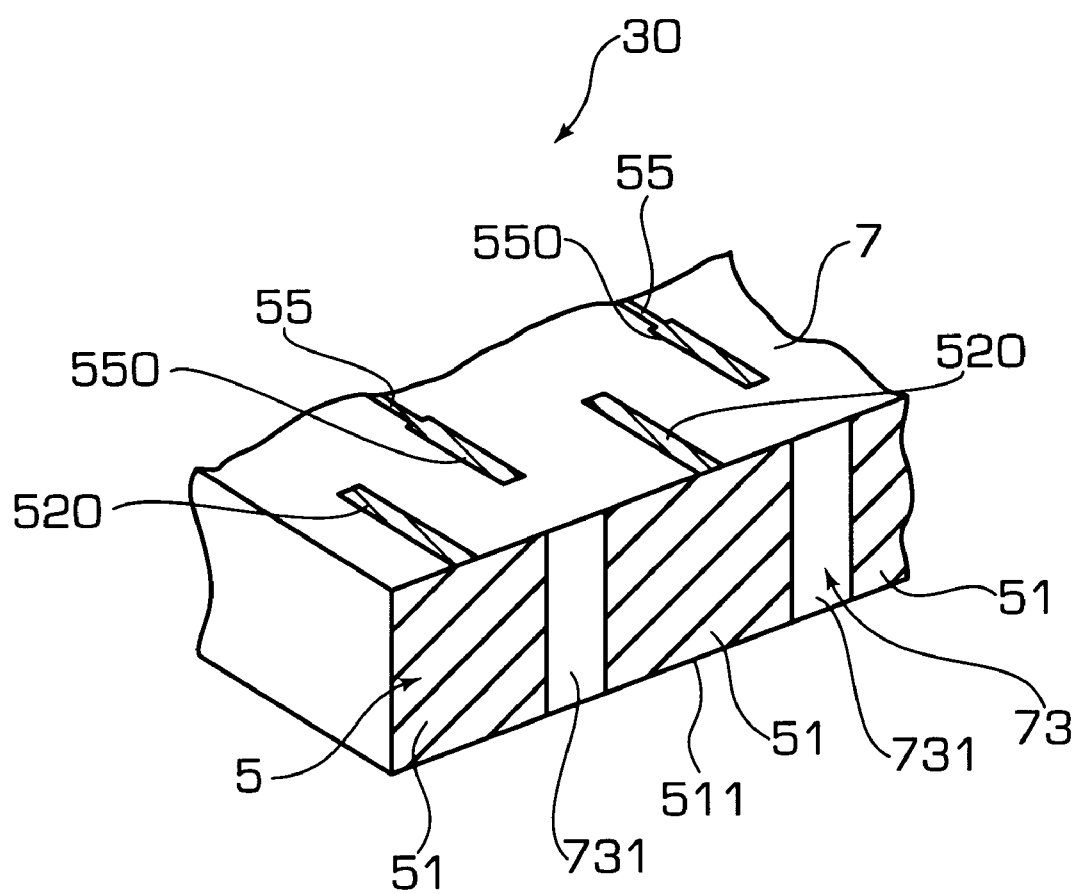
FIG. 26 is partial perspective view of an electronic parts mounting substrate showing a wall surface of a mount opening portion in an embodiment 5.
Figure 27:
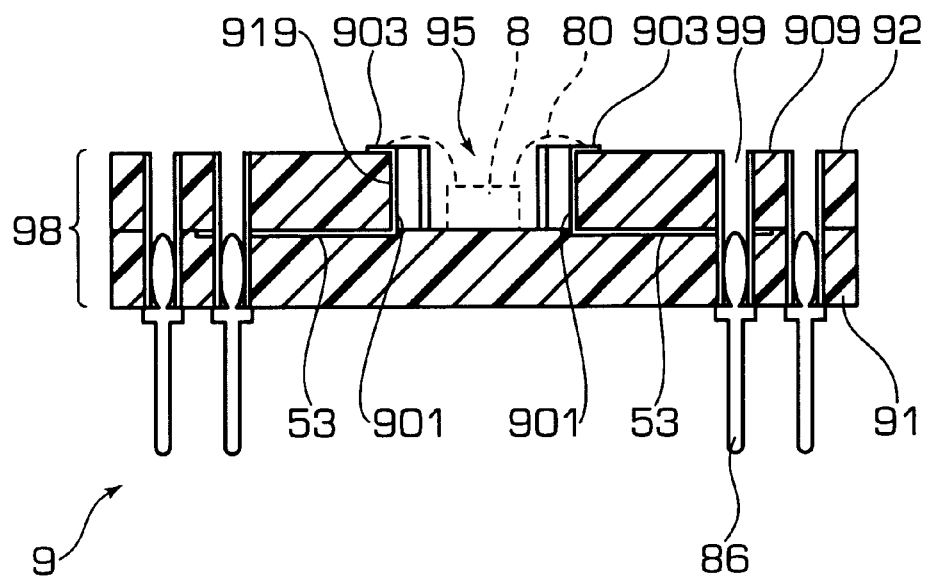
FIG. 27 is a cross-sectional view showing an electronic parts mounting substrate in a conventional example.
Figure 28:
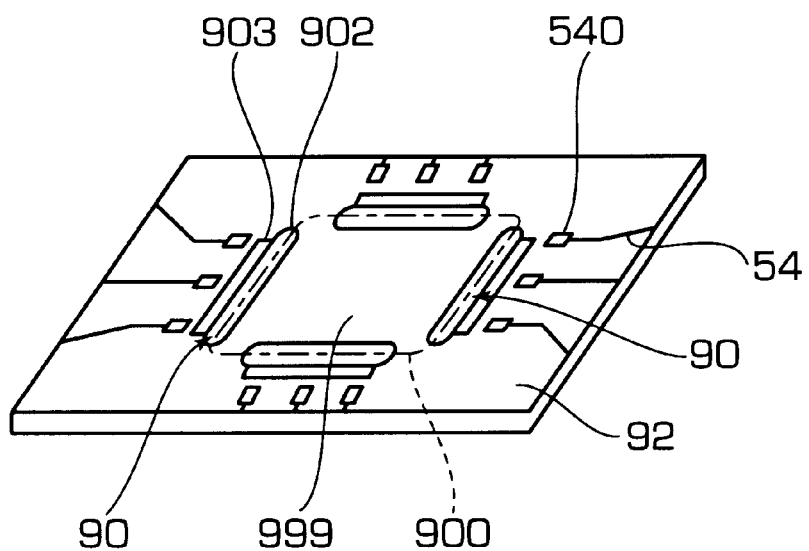
FIG. 28 is a perspective view of an insulating substrate to explain a method of forming side-surface patterns on a wall surface of a mount opening portion in the conventional example.
Figure 29:
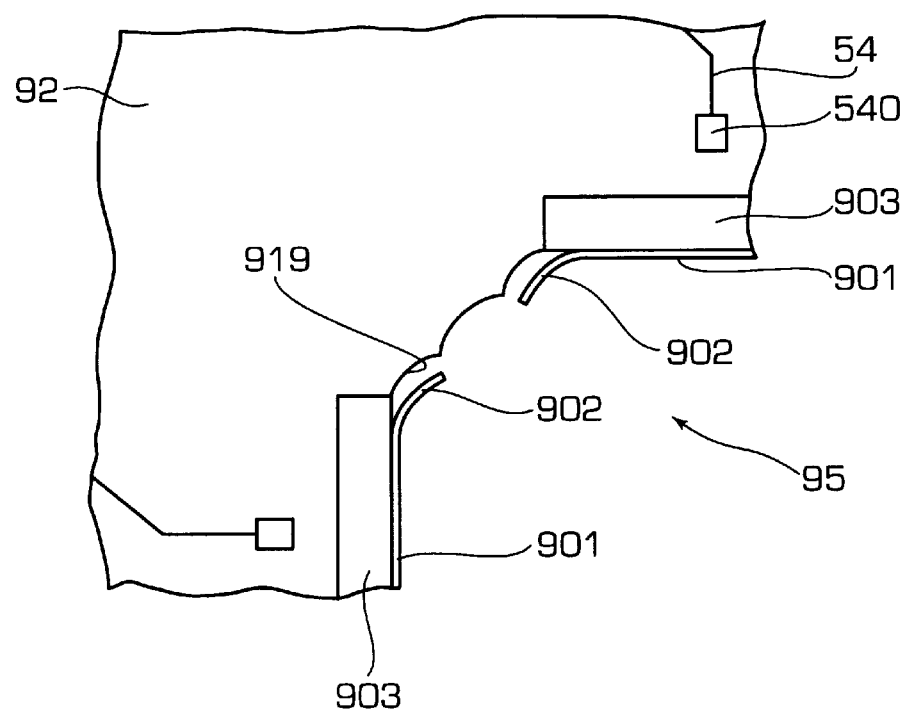
FIG. 29 is an explanatory diagram indicative of problems with the conventional example.
Figure 30:
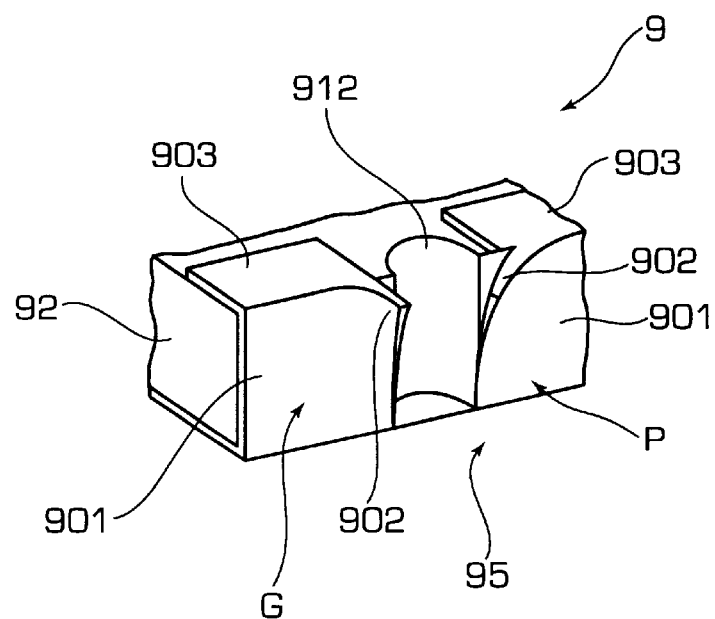
FIG. 30 is a partial perspective view showing another electronic parts mounting substrate in the conventional example.

This example is different from embodiment 4 in that the side-surface patterns 51 and the bonding pads 520 are directly connected to each other as shown in FIG. 26. In this example as well, the side-surface patterns 51 are not peeled off as in the embodiment 4, mounting of the electronic parts is facilitated, and the electronic parts mounting substrate 30 can be designed for high packing density and thinness.

INDUSTRIAL APPLICABILITY

As was described above, the present invention relates to an electronic parts mounting substrate in which side-surface patterns are disposed on side surfaces of a mount opening portion for mounting electronic parts, and a method of manufacturing same, with the advantages that the side-surface patterns can be prevented from being peeled off, and the side-surface patterns having a plurality of potentials can be readily formed.

What is claimed is:

1. An electronic parts mounting substrate comprising:

an insulating substrate comprising a mount opening portion for mounting electronic parts, said mount opening comprising a plurality of side walls and a plurality of projection portions formed in said insulating substrate that project toward an interior of the mount opening portion from said side walls; and a plurality of conductive side-surface patterns disposed on said side walls of said mount opening portion for providing a plurality of potentials, wherein opposite end portions of each of the side-surface patterns are respectively disposed on side surfaces of said projection portions of said mount opening portion.

2. An electronic parts mounting substrate as claimed in claim 1, wherein the length of said projection portion that extends from a base portion to an inner end thereof is 0.1 to 0.5 mm.

3. A method of manufacturing an electronic parts mounting substrate comprising an insulating substrate having a mount opening portion for mounting electronic parts therein, and conductive side-surface patterns disposed on side walls of said mount opening portion for providing a plurality of potentials, the method comprising the steps of:

forming a plurality of partition holes in the insulating substrate, wherein the partition holes are sectioned from each other by partition walls;

forming a metal plating film on wall surfaces of the partition holes; and removing portions of the partition walls between the partition holes to form the mount opening portion and the conductive side-surface patterns for providing a plurality of potentials formed on side walls of said mount opening portion, wherein remaining portions of the partition walls form projection portions which project toward an interior of said mount opening portion.

4. A method of manufacturing an electronic parts mounting substrate as claimed in claim 3, wherein the length of each of said projection portions that extends from a base portion to an inner end thereof is 0.1 to 0.5 mm.

5. A method of manufacturing an electronic parts mounting substrate comprising an insulating substrate having a mount opening portion for mounting electronic parts therein, and a plurality of conductive side-surface patterns disposed on wall surfaces of said mount opening portion for providing a plurality of potentials, the method comprising the steps of:

forming a recessed opening in the insulating substrate, said recessed opening comprising a plurality of side walls having a plurality of convex projection portions which project toward an interior of said recessed opening from said side walls;

forming a metal plating film on said side walls of said recessed opening; and removing an end portion of each of said projection portions to form the mount opening portion and the conductive side surface patterns.

6. A method of manufacturing an electronic parts mounting substrate as claimed in claim 5, wherein the length of each of said projection portions that extends from a base portion to an inner end thereof is 0.1 to 0.5 mm.

* * * * *